United States Patent [19]

Lüder et al.

[11] 4,443,774
[45] Apr. 17, 1984

[54] CTD TRANSVERSAL FILTER

[75] Inventors: Rainer Lüder, Oberhaching; Wolfgang Haussmann, Munich, both of Fed. Rep. of Germany

[73] Assignee: Siemens Aktiengesellschaft, Berlin and Munich, Fed. Rep. of Germany

[21] Appl. No.: 344,925

[22] Filed: Feb. 2, 1982

[30] Foreign Application Priority Data

Feb. 9, 1981 [DE] Fed. Rep. of Germany ....... 3104521

[51] Int. Cl.$^3$ .............................................. H03H 15/02
[52] U.S. Cl. ...................................... 333/165; 333/166
[58] Field of Search .............. 333/165, 166; 357/24 R

[56] References Cited

U.S. PATENT DOCUMENTS 4,231,002 10/1980 Knauer et al. ...................... 333/165
4,249,145 2/1981 Sakaue et al. .................. 333/166 X

OTHER PUBLICATIONS

"Charge Transfer Devices", 1975, C. H. Sequin and M. F. Tompsett, Academic Press, pp. 216–227.

*Primary Examiner*—Marvin L. Nussbaum
*Attorney, Agent, or Firm*—Herbert L. Lerner; Laurence A. Greenberg

[57] ABSTRACT

CTD transversal filter, for time delayed forming of a given input signal being weighted and subsequently summed for producing a filter characteristic, with weighting coefficients optionally having a negative and a positive sign, including a separate input stage for forming each desired weighting coefficient for obtaining a desired filter characteristic, the input signal being scanned by a common scanning frequency for all input stages, being converted to a charge packet proportional to its voltage and being time delayed in the input stages, the input stages for forming the negative weighting coefficients being formed in an inverting manner as compared to the input stages for forming the positive weighting coefficients, gate electrodes of the input stages, the areas of the gate electrodes of the input stages under which the charge packets are formed proportional to the input voltage, corresponding to the ratio of the absolute values of the required weighting coefficients, and a common output stage in which the input stages are combined.

5 Claims, 1 Drawing Figure

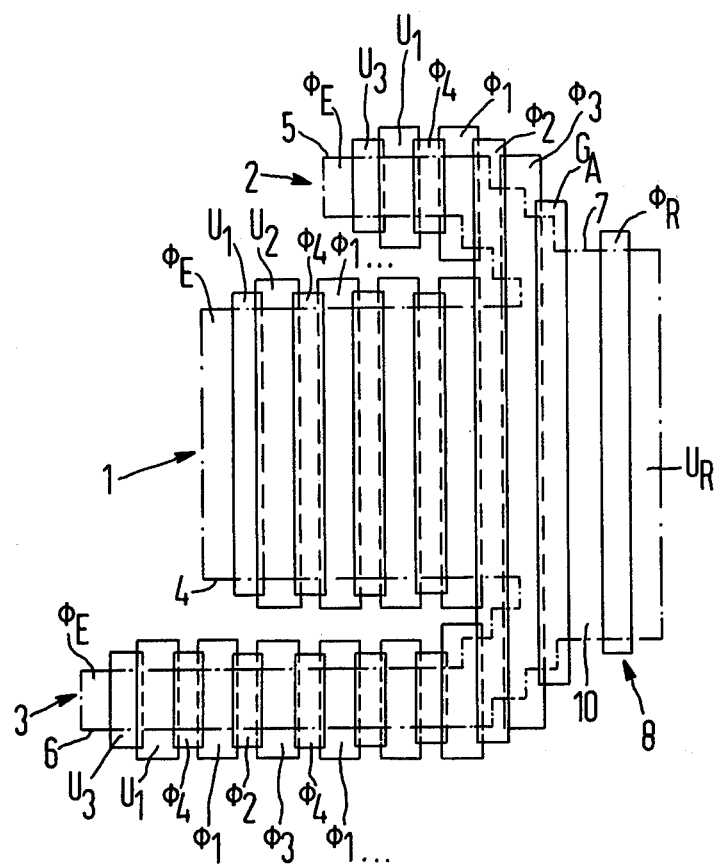

CTD TRANSVERSAL FILTER

The invention relates to a CTD transversal filter, where time delayed waveforms of any given input signal are weighted and subsequently summed for generating a filter characteristic, whereby the weighting coefficients can have a positive as well as a negative sign.

Generally, the transmission characteristic of a transversal filter is given by using a z-transformation:

$$H(z) = \frac{y(z)}{x(z)} = a_0 + a_1 z^{-1} + a_2 z^{-2} \ldots + a_n z^{-n},$$

where
- x (z) is the input signal,
- y (z) the output signal,
- $a_0 \ldots a_n$ are the weighting coefficients, and
- $z = e^{j\omega T}$, T being the time interval.

Transversal filters, fabricated accordingly in the CTD (Charge Transfer Device) technology, are known from a publication by C.H. Sequin and M.F. Tompsett, entitled "Charge Transfer Devices", 1975, Academic Press, pages 216-227. Filters such as these can be implemented by a CTD time delay module having a plurality of taps, on which the corresponding voltages are collected, subsequently weighted and summed in an electronically aligned and sign rectified way. Such an electronic weighting, however, requires additional CTD filter components and can affect the filter action in an undesirable way.

This drawback can be avoided by using split electrodes, the partial length of which can be selected according to the required magnitude of weighting coefficients; in this way, however, only positive weighting coefficients can be implemented. Furthermore, a differential amplifier or the like is still required for the summing stage.

It is accordingly an object of the invention to provide a CTD transversal filter which overcomes the hereinafore-mentioned disadvantages of the heretofore-known devices of this general type, and to find a remedy by creating a general-purpose CTD filter, which can be operated without any active peripherals such as amplifiers or the like.

With the foregoing and other objects in view there is provided, in accordance with the invention, a CTD transversal filter, for time delayed forming of a given input signal being weighted and subsequently summed for producing a filter characteristic, with weighting coefficients optionally having a negative and a positive sign, comprising a separate input stage for forming each desired weighting coefficient for obtaining a desired filter characteristic, the input signal being scanned or sampled by a common scanning or sampling frequency for all input stages, being converted to a charge packet proportional to its voltage and being time delayed in the input stages, the input stages for forming the negative weighting coefficients being formed in an inverting manner as compared to the input stages for forming the positive weighting coefficients, gate electrodes of the input stages, the areas or surfaces of the gate electrodes of the input stages under which the charge packets are formed proportional to the input voltage, corresponding to the ratio of the absolute values of the required weighting coefficients, and a common output stage in which the input stages are combined. In this way the implementation of negative weighting coefficients can also be accomplished, and with a direct filter output-signal tap at the CTD output without using any additional active peripherals.

In accordance with another feature of the invention, one of the input stages is inverting or constructed to be inverted, a first one of the gate electrodes is acted upon or loaded by an auxiliary voltage, and a second one of the gate electrodes is acted upon or loaded by the input signal.

In accordance with a further feature of the invention, one of the input stages is non-inverting or constructed to be non-inverted, first one of the gate electrodes is acted upon or loaded by the input signal, and a second one of the gate electrodes is acted upon or loaded by an auxiliary voltage.

In accordance with an added feature of the invention, the physical construction or space arrangement of the gate electrodes, under which the charge packets are formed proportional to the input voltage, is identical to that of the individual or separate input stages.

In accordance with an additional feature of the invention, there is provided gate oxide being disposed under the gate electrodes and in the input stages, the gate oxide disposed under the gate electrodes, under which the charge packets are formed proportional to the input voltage, being identical in composition and thickness to the gate oxide in the individual or separate input stages.

In accordance with a concomitant feature of the invention, the individual or separate input stages are constructed in the same technological manner.

Other features which are considered as characteristic for the invention are set forth in the appended claims.

Although the invention is illustrated and described herein as embodied in a CTD transversal filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing which is an embodiment of the CTD filter according to the invention.

Referring now to the FIGURE of the drawing in particular, there are seen charge transfer channels and electrode configuration of a CTD filter constructed as a CCD (Charge Coupled Device), which provides the filter characteristic:

$$H_1(z) = K_2 + K_1 z^{-1} + K_3 z^{-2},$$

with $K_1 > 0$ and $K_2, K_3 < 0$. The filter selected as an embodiment is a four-phase circuit having three separate but commonly addressed input stages, which operate according to the so-called "fill and spill"-method.

The injection of charges into the input potential trough of a CCD according to the "fill and spill"-method is known and is described in more detail in the hereinafore-mentioned publication "Charge Transfer Devices", on pages 48-50 thereof. The three input stages 1, 2, 3 of the CCD filter each have one transfer channel 4, 5, 6, respectively, shown in dot-dash lines, above which various gate electrodes are disposed in a known manner. The input signal applied to the electrodes $U_1$ of each input stage 1, 2, 3 is sampled by means of an input clock frequency or pulse, which is common to all input stages 1, 2, 3 and is applied to the input diodes. The signals $U_2$, $U_3$ are auxiliary signals (d-c voltages).

A memory or storage cell of the four-phase CCD has four electrodes which are addressed by the clock phases $\phi_1$, $\phi_2$, $\phi_3$, $\phi_4$. The clock frequencies are identical with the sampling frequency while the phases are shifted against each other by one-quarter of a period.

The input stage 2 has one memory cell; the input stage 1 has two memory cells; and the input stage 3 has three memory cells. Because the three channels 4, 5, 6 of the input stages 1, 2, 3 are combined in a common channel 7, the input signal reaches this common channel 7 through the input stage 2 one clock-pulse earlier than through the input stage 1, while the input signal through the input stage 3 reaches this common channel 7 one clock-pulse period later than through the input stage 1. In the common channel 7, the signals of the output stages 1, 2, 3 are summed so that the filter produced that way has the form:

$$H_1(z) = K_2 + K_1 z^{-1} + K_3 z^{-2}.$$

The selection of the coefficients $K_1$, $K_2$, and $K_3$ determines the pulse response of the filter; the absolute value and sign of the coefficients being determined by the construction of the input stages assigned to the respective coefficient. The ratio between the absolute value of the coefficients is established by the area or surface ratio of the electrodes, under which the charge proportional to the input voltage is formed. This means that the effective surface or area of the electrodes is selected in such way that the ratio between these surfaces or areas corresponds to the required ratio between the coefficients.

To assure an otherwise uniform type of input characteristics, the spatial disposition or physical construction and production technology of the input electrodes, or of the input stages, respectively, the composition and thickness of the thin-oxide lying under the electrodes, and the base doping of the channels should in particular be of one uniform type.

Negative signs of the coefficients $K_1$, $K_2$, $K_3$ are provided by constructing input stages yielding a negative coefficient, inverting from input stages yielding a positive coefficient. This is the case in the embodiment for the input stages 2 and 3. If the input signal $U_1$ addresses the first electrode of the input stage, then the circuit operates in a non-inverting mode. If, in contradistinction, the signal $U_1$ is applied to the second electrode, an inverting mode of operation results. Accordingly, in the example shown in the FIGURE, the outer input stages 2, 3 operate in an inverting manner, while the central input stage 1 operates in a non-inverting way, meaning that the coefficients $K_2$ and $K_3$ are negative, and the coefficient $K_1$ is positive.

The desired absolute magnitude of weighting coefficients can be obtained by amplification of the output signal.

The formation of the output stage 8, in which the charge packet that is summed in the common channel 7 is transformed into a proportional voltage, is known, for example, from the above-mentioned publication "Charge Transfer Devices". In the FIGURE the output gate is designated with the reference symbol $G_A$, the reset pulse with reference symbol $\phi_R$, and the reset voltage with reference symbol $U_R$. The output signal is fed to an output circuit through a connection 10. Instead of the construction as shown in the FIGURE, where the output stage 8 is connected directly to the input stages 1, 2, 3, it is also feasible to provide a short common channel section between input stages 1, 2, 3 and the output stage 8, with which the transit or delay-time base of the device can be set.

The embodiment shown operates with a four-phase clock pulse, however, an equally feasible construction is a CTD filter having, for example, a 2 or 3-phase clock pulsed operation.

With high pulse or clock frequencies it is recommended that the channels 4, 5, 6 between the input stages 1, 2, 3 and the junction to the common channel 7 be constructed in such a way that the distance covered by the charge carriers from electrode to electrode is only increased to a minimal extent. As shown in the FIGURE, this can be done in an advantageous way such that the channels 5 and of the input stages 2 and 3 toward the central channel 4 are constructed in a stepped way.

With the CTD filter according to the invention a generally non-recursive filter can be obtained, a filter having any given weighting coefficient sign and having completely relinquished the use of any active peripheral, meaning that output signal of the filter and output signal of the CTD are identical.

If the desired filter characteristic $H(z)$ can be so expressed in factored form such that:

$$H(z) = H_1(z) \cdot H_2(z) \ldots \cdot H_n(z)$$

then the desired filter can be created by series-connected individual CTD filters, which implement or synthesize the functions $H_1(z)$ through $H_n(z)$. In cases of partial filters, where negative weighting coefficients are required, the filter is advantageously constructed according to the invention and is applied to the respective input signal point of the series-connection being acted upon.

We claim:

1. CTD transversal filter, for time delayed forming of a given input signal being weighted and subsequently summed for producing a filter characteristic, with weighting coefficients optionally having a negative and a positive sign, comprising a separate input stage for forming each desired weighting coefficient for obtaining a desired filter characteristic, said input signal being scanned by a common scanning frequency for all input stages, being converted to a charge packet proportional to its voltage and being time delayed in said input stages, first gate electrodes connected to said input stages forming the positive weighting coefficients, second gate electrodes connected to said input stages forming the negative weighting coefficients in an inverting manner as compared to said positive weighting coefficients, said first and second gate electrodes having surface areas under which said charge packets are formed proportional to the input voltage, said surface areas corresponding in size to the ratio of the absolute values of the required weighting coefficients, and a common output stage in which said input stages are combined.

2. CTD transversal filter according to claim 1, wherein one of said input stages is inverting, one of said first gate electrodes is acted upon by an auxiliary voltage, and one of said second gate electrodes is acted upon by the input signal.

3. CTD transversal filter according to claim 1, wherein one of said input stages is non-inverting, one of said first gate electrodes is acted upon by the input signal, and one of said second gate electrodes is acted upon by an auxiliary voltage.

4. CTD transversal filter according to claim 1, 2 or 3, wherein the dimensions of all of said gate electrodes are identical to each other.

5. CTD transversal filter according to claim 1, including gate oxide being disposed under said gate electrodes, said gate oxide disposed under each of said gate electrodes being equal in composition and thickness to each other.

* * * * *